US011088200B1

(12) United States Patent
Xiao

(10) Patent No.: US 11,088,200 B1
(45) Date of Patent: Aug. 10, 2021

(54) LATTICE MATCHED SEED LAYER TO IMPROVE PMA FOR PERPENDICULAR MAGNETIC PINNING

(71) Applicant: Rongfu Xiao, Dublin, CA (US)

(72) Inventor: Rongfu Xiao, Dublin, CA (US)

( * ) Notice: Subject to any disclaimer, the term of this patent is extended or adjusted under 35 U.S.C. 154(b) by 75 days.

(21) Appl. No.: 16/786,304

(22) Filed: Feb. 10, 2020

(51) Int. Cl.
| | |
|---|---|
| G11C 11/16 | (2006.01) |
| H01L 27/22 | (2006.01) |
| H01L 43/02 | (2006.01) |
| H01F 10/32 | (2006.01) |
| H01L 43/10 | (2006.01) |

(52) U.S. Cl.
CPC ....... *H01L 27/222* (2013.01); *H01F 10/3254* (2013.01); *H01F 10/3272* (2013.01); *H01L 43/02* (2013.01); *H01L 43/10* (2013.01)

(58) Field of Classification Search
CPC ..... G11C 11/161; H01L 27/222; H01L 43/02; H01L 43/08; H01L 43/10
USPC ....................................................... 257/421
See application file for complete search history.

(56) References Cited

U.S. PATENT DOCUMENTS

| | | | | |
|---|---|---|---|---|
| 6,828,036 B1* | 12/2004 | Munteanu | ............ | G11B 5/7369 |
| | | | | 428/828.1 |
| 10,468,457 B1* | 11/2019 | Zeng | ........................ | H01L 43/10 |
| 2003/0180577 A1* | 9/2003 | Do | ............ | G11B 5/82 |
| | | | | 428/836.1 |
| 2008/0311431 A1* | 12/2008 | Fuji | ...................... | G11B 5/3903 |
| | | | | 428/836 |
| 2010/0226048 A1* | 9/2010 | Fukuzawa | ............ | G11B 5/3983 |
| | | | | 360/324.12 |
| 2012/0181537 A1* | 7/2012 | Cao | ........................ | H01L 43/08 |
| | | | | 257/53 |
| 2017/0338829 A1* | 11/2017 | Lu | ............................. | H03L 7/26 |
| 2019/0051822 A1* | 2/2019 | Chatterjee | ............ | H01F 10/3272 |
| 2019/0252601 A1* | 8/2019 | Chatterjee | ............ | H01F 10/3254 |
| 2020/0052191 A1* | 2/2020 | Ma | ........................ | H01L 27/228 |
| 2021/0134504 A1* | 5/2021 | Ma | ........................ | H01L 43/08 |

* cited by examiner

*Primary Examiner* — Jami Valentine Miller

(57) ABSTRACT

The invention comprises a novel composite seed layer with lattice-matched crystalline structure so that an excellent epitaxial growth of magnetic pinning layer along its FCC (111) orientation can be achieved, resulting in a significant enhancement of PMA for perpendicular spin-transfer-torque magnetic-random-access memory (pSTT-MRAM) using perpendicular magnetoresistive elements as basic memory cells which potentially replace the conventional semiconductor memory used in electronic chips, especially mobile chips for power saving and non-volatility.

20 Claims, 4 Drawing Sheets

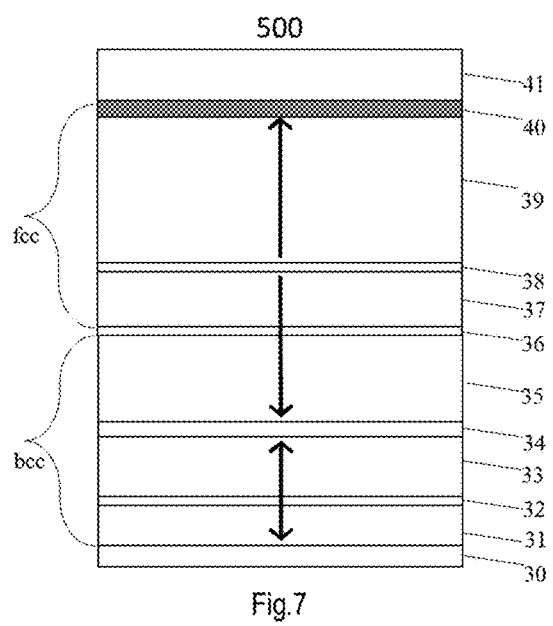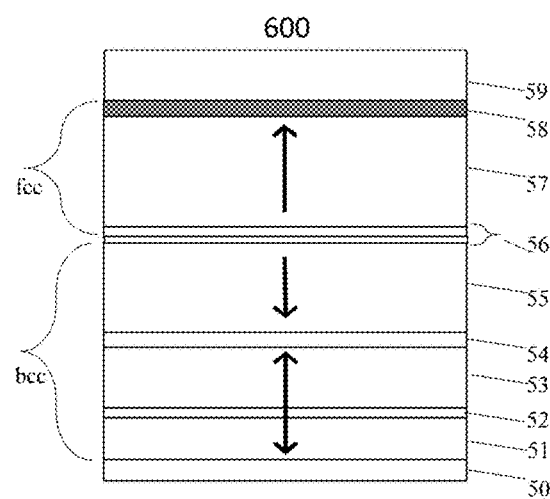

LATTICE MATCHED SEED LAYER TO IMPROVE PMA FOR PERPENDICULAR MAGNETIC PINNING

BACKGROUND OF THE INVENTION

1. Field of the Invention

This invention relates to a novel lattice-matched seed layer (LmSL) to improve perpendicular magnetic anisotropy (PMA) for magnetic pinning multilayer in a magnetic structure, such as a perpendicular magnetic tunnel junction.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a storage layer (SL) having a changeable magnetization direction, an insulating spacing layer, and a fixed pinning layer (PL) that is located on the opposite side from the SL and maintains a predetermined magnetization direction. The insulating spacing layer sandwiched between the SL and the PL serves as a tunneling barrier (TB) in a magnetic tunnel junction. In a SOT MRAM, there is an additional SOT layer immediately located on a surface of the SL, which is opposite to a surface of the SL where the insulating spacing layer is provided. SOT can be a thin layer made of heavy transition metal layer such as W or Ta, Pt, etc., or a layer of topological insulating layer such as BiSB.

As a write method to be used in such magnetoresistive elements of a STT MRAM, there has been suggested a write method (spin torque transfer switching technique) using spin momentum transfers. According to this method, the magnetization direction of a storage layer (SL) is reversed by applying a spin-polarized current to the magnetoresistive element. Furthermore, as the volume of the magnetic layer forming the SL is smaller, the injected spin-polarized current to write or switch can be also smaller. Accordingly, this method is expected to be a write method that can achieve both device miniaturization and lower currents. In a SOT MRAM, an electric current flows in the SOT layer, which is also a paramagnetic layer, to generate a spin-polarized current and inject it into its adjacent recording layer, which is a ferromagnetic layer. The spin-polarized current then exerts a torque on the magnetic moment to reverse it.

Further, as in a so-called perpendicular pMTJ element, both two magnetization films, i.e., the storage layer (SL) and the pinning layer (PL), have easy axis of magnetization in a direction perpendicular to the film plane due to their strong perpendicular interfacial anisotropy and magnetic crystalline anisotropy (shape anisotropies are not used), and accordingly, the device shape can be made smaller than that of an in-plane magnetization type. Also, variance in the easy axis of magnetization can be made smaller. Accordingly, by using a material having a large perpendicular magnetic crystalline anisotropy, both miniaturization and lower currents can be expected to be achieved while a thermal disturbance resistance is maintained.

There has been a known technique for achieving a high MR ratio in a perpendicular MTJ element by forming an underneath MgO tunnel barrier layer and a BCC or HCP-phase cap layer that sandwich a thin storage layer (SL) having an amorphous CoFeB ferromagnetic film and accelerate crystallization of the amorphous ferromagnetic film to match interfacial grain structure to MgO layer through a thermal annealing process. The SL crystallization starts from the tunnel barrier layer side to the cap layer and forms a CoFe grain structure having a perpendicular magnetic anisotropy, as Boron elements migrate into the cap layer. Accordingly, a coherent perpendicular magnetic tunnel junction structure is formed. By using this technique, a high MR ratio can be achieved.

A core structure of the pMTJ stack comprises (see FIG. 1) a fixed perpendicular magnetic pinning element (pMPE-70), a tunnel barrier, and a variable storage layer (SL-90). The pMPE is typically formed by a relatively thick perpendicular synthetic antiferromagnetic (pSAF) stack of composition: seed-layer/[Co/X]$_m$/Co/Ru/Co/[X/Co]$_n$/crystal-structure-breaking-layer (15)/FeCoB reference layer (16)/tunnel barrier (17), where X represents Pt, Pd or Ni metals, m and n are integers (normally m>n), and Ru is a spacer to provide perpendicular RKKY coupling between [Co/X]$_m$/Co and Co/[X/Co]$_n$. Here and thereafter throughout this application, each element written in the left side of "l" is stacked below an element written in the right side thereof. A typical film stack of bottom-pinned pMTJ (100) is shown in FIG. 1 which starts on a substrate (10), a seed layer (11) such as Pt, a perpendicular synthetic antiferromagnetic (pSAF) multi-layer stack containing a perpendicular magnetic pinning layer (pMPL-12) [Co/Pt]$_m$/Co, a Ru spacer (13), an upper magnetic multilayer (14) such as Co/[Pt/Co]$_n$, a crystal structure transition layer (15) such as W, Mo or Ta, a magnetic reference layer (16) such as amorphous CoFeB, a TB MgO (17), a tri-layer SL formed with a first storage layer (18) such as CoFeB, a non-magnetic B absorption layer (19) such as W, Mo or Ta and a second storage layer (20) such as CoFeB, a capping layer (21), such as MgO, W or W/Ru. This pMTJ comprises a thick pMPE film stack although it has a strong pSAF.

Recently a French research group proposed (see *Scientific Reports* 8, *Article number:* 11724, 2018) a thin synthetic antiferromagnetic (tSAF) structure (see FIG. 2) comprising a Pt seed-layer (11) on which pinning layer [Co/Pt]m/Co (12), bi-layer Ru/W spacer (23) and magnetic reference layer CoFeB (16). Although the authors claimed multi-functionalities of their bi-layer Ru/W spacer (23): (i) absorbing boron out of the magnetic layer (FeCoB) in contact with W layer upon annealing, (ii) allowing the crystalline transition between the FCC part of the stack [Co/Pt]m/Co of 3-fold symmetry and the BCC part of the stack FeCoB next to the MgO barrier (of 4-fold symmetry) and (iii) preventing interdiffusion between the two parts of the SAF during high temperature annealing. RKKY coupling at W/CoFeB interface is not as strong as at the Co/Ru interface, such tSAF exhibits a serious magnetic instability during information writing.

No matter whether it is a thick pSAF or thin tSAF film stack, a key factor to achieve stable magnetic pinning is perpendicular magnetic anisotropy (PMA) of the perpendicular magnetic pinning layer (pMPL) [Co/Pt]m/Co (12), which provides a magnetic anchoring force to prevent the entire pSAF (or tSAF) film stack from a concurrent rotation under the influence of spin transfer torque or an external magnetic field. It was reported (see Article: *Appl. Phys. Len.* 96, 152505(2010)) that the PMA of Co/Pt (or Co/Pd) magnetic multilayer is closely dependent on the lattice constant of the multilayer itself, and a positive (perpendicular) PMA occurs only when Co/Pt (or Co/Pd) multilayer has FCC crystalline structure with a lattice constant larger than ~0.372 nm, and the larger the lattice constant, the higher is the PMA of Co/Pt (or Co/Pd) multilayer. Without an external factor, increase of the PMA of Co/Pt (or Co/Pd) can only be achieved by increasing the thickness of Pt (or Pd) spacer. However, a research group found (see their report: *Sensors*, 17(12): 2743, December 2017) that the effective energy per bilayer starts to decrease linearly after a lattice constant value of ~0.383 nm. They attributed this to the enhanced increase in the Pd fraction compared to the Co, which weakens the ferromagnetic coupling between the adjacent ultrathin Co layers.

SUMMARY OF THE PRESENT INVENTION

The present invention discloses a lattice-matched seed layer (LmSL) having FCC crystalline structure to promote a perfect FCC (111) growth for above perpendicular magnetic pinning layer (pMPL) to enhance its PMA needed for magnetic stabilization. Said LmSL comprises:

a bi-layer stack containing (Rh, Cu, Al, Ag, or Au)/(Pt, Pd, or Ir) or (alloy of Rh, Cu, Al, Ag, or Au)/(Pt, Pd, or Ir) having a FCC crystalline structure with its lattice constant matched with said pMPL;

or bi-layer stack containing (RhN, CuN, AlN, or AgN)/(Pt, Pd, or Ir) or (alloy of RhN, CuN, AlN, or AgN)/(Pt, Pd, or Ir) with nitrogen (N) content tuned so that said RhN, CuN, AlN, AgN having its lattice constant matched with said pMPL;

or a multi-layer stack containing (RhN, CuN, AlN, or AgN)/X/(Pt, Pd, or Ir) or (alloy of RhN, CuN, AlN, or AgN)/X/(Pt, Pd, or Ir) with nitrogen (N) content tuned so that said RhN, CuN, AlN, AgN having its lattice constant matched with Pt, Pd, or Ir and having a thickness between 0.5 nm-10 nm, whereas X is a thin layer consisting of one or more transition metal elements selected from the group of Ta, Mo, Hf, W, Nb, Zr, Ru and having a thickness between 0.1 nm-2 nm.

Said LmSL and pMPL both having an FCC crystalline structure together with a composite non-magnetic spacer (CnmS) and a perpendicular magnetic reference layer (pMRL) having a body-center-cubic (BCC) crystalline structure constitute a strong perpendicular magnetic pinning element (pMPE): LmSL/pMPL/CnmS/pMRL with enhanced synthetic antiferromagnetic (eSAF) coupling.

Said pMRL comprises a multilayer stack containing [Co/(Pt, Pd or Ni)]m/Co, and said CnmS comprises either a single layer of Ru, or Ir or a bi-layer of (Ru, Rh or Ir)/Cr or tri-layer of (Ru, Rh, or Ir)/(W, Mo, or V)/Cr, and said pMRL comprises a multilayer stack either of Co/[(Pt, Pd or Ni)]n/Co/(W, Mo, or Ta)/CoFeB for single layer Ru spacer, or Fe/CoFeB, Fe/FeB, FeB/CoFe for bilayer or tri-layer CnmS.

Said pMPE with large PMA are employed to form a perpendicular magnetoresistive element (pMRE) comprising LmSL/pMPL/CnmS/pMRL/TB/SL/CL or a reverse structure of BCC seed layer/SL/TB/PMRL/CnmS/pMPL/LmSL, and wherein said TB is a tunnel barrier, SL is a storage layer (SL) having magnetic anisotropy in a direction perpendicular to a film surface and having a variable magnetization direction on the tunnel barrier layer and CL is a capping layer.

Application of said pMRE including bottom-pinned pSTT-MRAM, top-pinned pSTT-MRAM and dual-pinned pSTT-MRAM. Said pMRE is sandwiched between an upper electrode and a lower electrode of each MRAM memory cell, which also comprises a write circuit which bi-directionally supplies a spin polarized current to the magnetoresistive element and a select transistor electrically connected between the magnetoresistive element and the write circuit.

BRIEF DESCRIPTION OF THE DRAWINGS

FIG. 7 A top-pinned pSTT-MRAM containing a thick pSAF capped by LmSL.

FIG. 8 A top-pinned pSTT-MRAM containing a thin tSAF capped by LmSL.

Table 1 List of crystalline structure and corresponding lattice constant for some selected metallic elements.

DETAILED DESCRIPTION OF THE INVENTION

Figure 1:
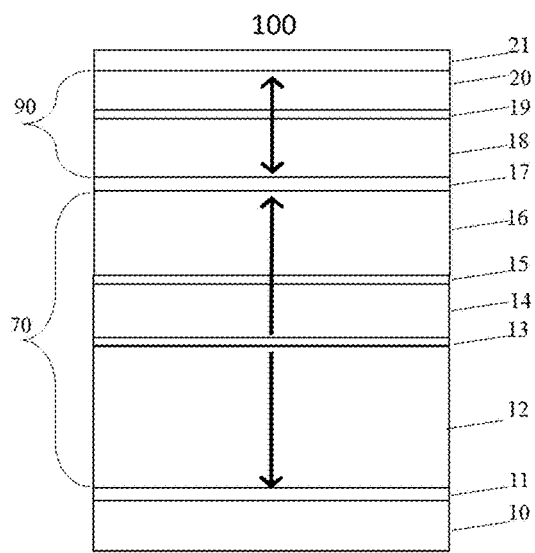
FIG. 1 A conventional pSTT-MRAM film stack with a perpendicular synthetic antiferromagnetic (pSAF) pinning layer.
Figure 2:
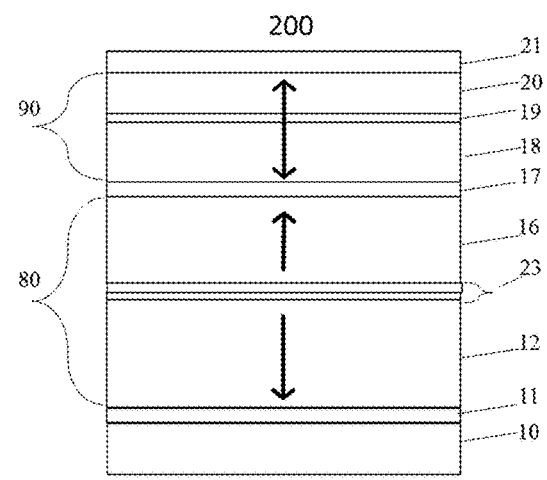
FIG. 2 A pSTT-MRAM film stack with a thin synthetic antiferromagnetic (tSAF) pinning layer.
Figure 3:
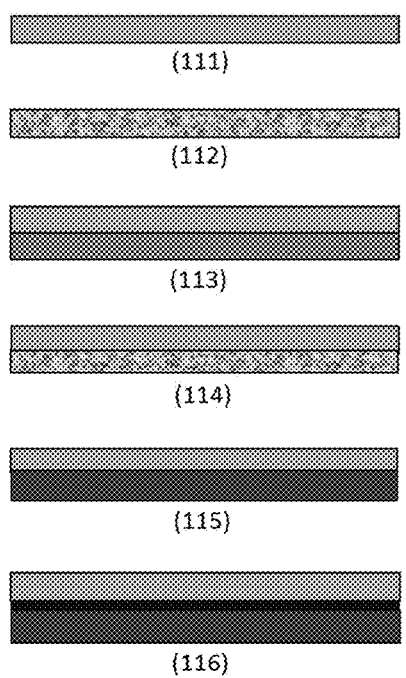
FIG. 3 Various configurations of said LmSL.

From prior art discussion, the PMA of the perpendicular magnetic pinning layer (pMPL) (Co/Pt (or Co/Pd) multilayer) is closely related to its lattice constant, and the larger is the lattice constant, the higher is its PMA. In this invention, we employ a lattice-matched seed layer (LmSL) with FCC (111) crystalline structure at the bottom of Co/Pt or Co/Pd multilayer to provide a specially engineered lattice mold (bedding) for the growth of Co/Pt or Co/Pd multilayer to maximize its PMA. Among the various materials in periodical table, there are some metallic elements (see Table 1) which naturally form an FCC crystalline structure in their solid phase with lattice constant close to or slightly larger than that of Co/Pt (or Co/Pd). Said LmSL is in direct contact with said pMPL either from below or on the top as a cap with a thickness between 0.5 nm-10 nm; and said LmSL comprise several film configurations as below:

(1) said LmSL is a bi-layer stack containing (Rh, Cu, Al, Ag, or Au)/(Pt, Pd, or Ir) (stack 113 in FIG. 3) or (alloy of Rh, Cu, Al, Ag, or Au)/(Pt, Pd, or Ir) (stack 114 in FIG. 3) having a FCC crystalline structure with its lattice constant matched with said pMPL; wherein for the alloyed LmSL, an element with a larger lattice constant (such as Al, Ag, Au) can be mixed with element having a smaller lattice constant (such as Ni or Cu) to form a just-right lattice constant to maximize the PMA for Co/Pt (or Co/Pd) multilayer;

(2) said LmSL is a bi-layer stack containing (RhN, CuN, AlN, or AgN)/(Pt, Pd, or Ir) or (alloy of RhN, CuN, AlN, or AgN)/(Pt, Pd, or Ir) (stack 115 in FIG. 3) with nitrogen (N) content tuned so that said RhN, CuN, AlN, AgN having its lattice constant matched with or larger than Pt (or Pd); wherein the metal nitridation is done by ion assisted physical vapor deposition (PVD) or ion bean deposition(IBD); wherein said lattice constant of nitrides (RhN, CuN, AlN, or AgN) can be increased by adding more nitrogen (N2) gas to Ar gas during deposition, for example to a nitrogen-rich CuN can have a lattice constant of 0.388 nm.

(3) said LmSL is a tri-layer stack (stack 116 in FIG. 3) containing (RhN, CuN, AlN, or AgN)/X/(Pt, Pd, or Ir) or (alloy of RhN, CuN, AlN, or AgN)/X/(Pt, Pd, or Ir) with nitrogen (N) content tuned so that said RhN, CuN, AlN, AgN having its lattice constant matched with Pt (or Pd), whereas X is a thin layer consisting of one or more transition metal elements selected from the group of Ta, Mo, Hf, W, Nb, Zr, Ru and has a thickness no more than 2 nm. Adding of such transition metal in between, crystalline structure (lattice constant and crystalline orientation) said LmSL can be optimized to further enhance PMA for said pMPL.

The following lists are some typical embodiments to illustrate the use of said LmSL to increase PMA for perpendicular magnetic stabilization for bottom-pined, top-pined and dual-pinned pSTT-MRAM having either a thick pSAF or thin tSAF film stack:

First Embodiment

Figure 4:
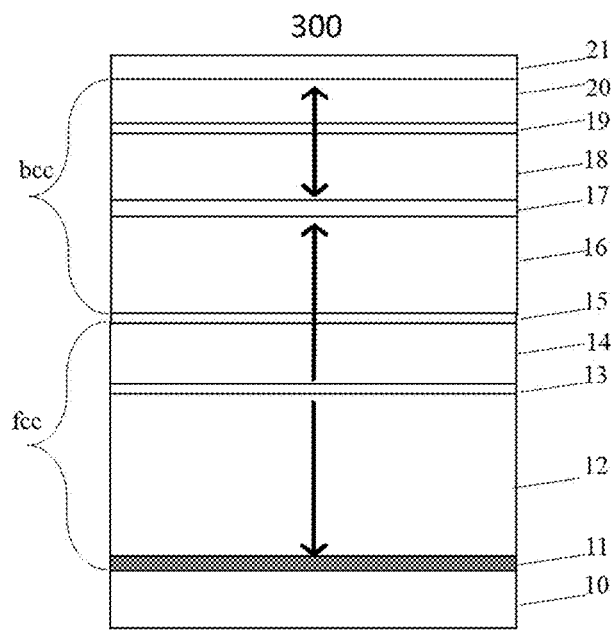
FIG. 4 A bottom-pinned pSTT-MRAM with a thick pSAF film stack.

FIG. 4 is bottom-pinned pSTT-MRAM (300) with a thick pASF film stack. A lattice-matched seed layer (LmSL) (11) was first grown on substrate with a thickness between 0.5-10 nm on a substrate, followed by a thick pSAF stack (12/13/14) of [Co/Pt or Pd]$_m$Co/(Ru or Ir)/Co/[(Pt or Pd)/Co]$_n$ with thickness values of (0.3-0.7) for Co and 0.2-0.8 for Pt (or Pd) and repetition number (m>n) between 2-6 for m and 1 to 4 for n, followed by a crystalline structure transition layer (15) of Ta, W, or Mo with thickness between 0.1-0.5 nm, and magnetic reference layer (16) of CoFeB with thickness between 0.9-1.3 nm, a tunnel barrier (17) of MgO between 0.8-1.2 nm, a composite storage layer of first magnetic CoFeB (18) with thickness between 1.0-1.5 nm, B absorption layer of Ta, W, Mo) (19) with thickness between 0.15-0.5 nm, second magnetic CoFeB (20) with thickness between 0.5-1.0 nm and a capping stack of MgO/W/Ru (21) with thickness of (1.0-1.5 nm)/1-3 nm)/(2-5 nm) respectively. The annealing temperature of above film stack is between 350 C-450 C for 30 min to 150 min. With the help of said LmSL, after annealing the bottom portion of the stack between 11-14 will be converted into FCC crystalline structure with (111) orientation normal to substrate surface and upper portion of the stack (16-21) into a BCC (100) crystalline structure to achieve a large PMA while maintaining high tunnel magnetoresistive (TMR) value. During annealing the layer (15) of Ta, W, or Mo helped the crystalline transition between bottom FCC to top BCC structure.

Second Embodiment

Figure 5:
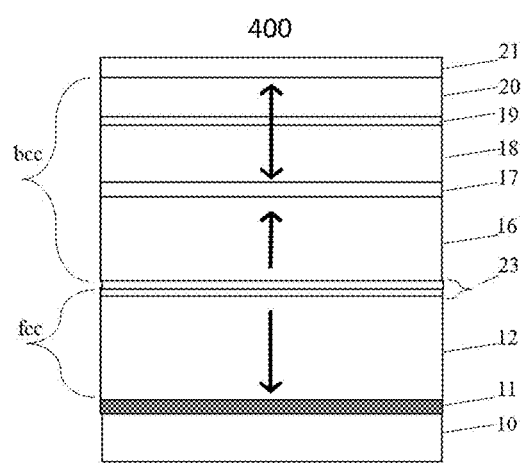
FIG. 5 A bottom-pinned pSTT-MRAM with a thin tSAF film stack.

FIG. 5 is a bottom-pinned pSTT-MRAM with a thin film stack (400) with an enhanced synthetic antiferromagnetic (eSAF) coupling. A lattice-matched seed layer (LmSL) (11) was first grown with a thickness between 1-8 nm on a substrate (10), followed by a magnetic superlattice [Co/X]$_m$ (m is an integer between 2-6) with thickness of Co(0.25-0.6 nm)/X(0.2-0.4 nm) (12) on top of the seed layer where X is selected among Pt, Pd or Ni, a composite eSAF Co/(Ru or Ir)/Cr/Fe (33) or Co/(Ru, Rh, or Ir)/(W, or Mo)/Cr/Fe, an amorphous FeB or CoFeB (16) reference layer in contact with Fe from below, a tunnel barrier MgO (17), a tri-layer recording layer formed with a first magnetic layer (18), a non-magnetic bridging layer (19) and a second magnetic layer (20), a capping layer, such as MgO, W or W/Ru (21).

In the above stack, the thickness of Ru, Ru or Ir is between 0.3 to 0.7 nm and Cr or (W or Mo)/Cr thickness is between 0.1 to 0.5 nm, with a combined (Ru, Rh, or Ir)/Cr or (Ru, Rh, or Ir)/(W or Mo)/Cr thickness chosen to reach the first or second peak for an effective RKKY coupling, the amorphous FeB or CoFeB reference layer (16) has a B composition between 15-35% with a thickness between 0.8 to 1.4 nm, the thickness of MgO TB is between 0.8-1.2 nm, the thickness of the first magnetic memory layer (20) can be selected among CoFeB, FeB, Fe/CoFeB with a B composition between 15-30% and preferably at 20% and a thickness between 1-1.6 nm, the non-magnetic bridging layer is selected among W, Mo, Ta with a thickness between 0.1-0.6 nm, the second magnetic memory layer (20) is selected from CoFeB, FeB with a B composition between 15-30% with a thickness between 0.4-0.8 nm, the capping layer is can be either (1-1.5 nm)MgO/(2-5 nm)W, (2-5 nm)W/(2-4 nm)Ru or MgO/W/Ru. The use of Fe at the Cr interface, not only increases the RKKY coupling hence improving magnetic stability for the device, but also creates a good BCC structure right starting from the CoFeB reference layer, throughout the barrier MgO layer to the entire memory tri-layer layer owing to the intrinsic BCC structure of Fe. Such a bottom-pinned pSTT-MRAM film stack will have strong magnetic pinning with sharp layer interfaces and higher and stable TMR characteristics, which is good for pSTT-MRAM device application.

Figure 6:
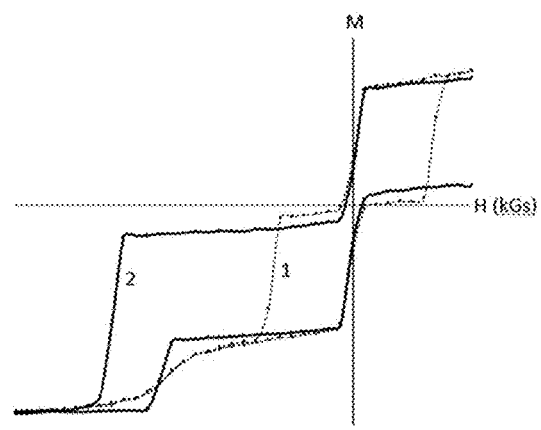
FIG. 6 Experimental results of magnetization for two thin pSTT-MRAM film stacks without and with LmSL.

The annealing temperature of above bottom-pinned film pSTT-MRAM stacks are between 350 C-450 C for 30 min to 150 min. With the help of said LmSL, after annealing the low portion (11-13) of the stack including Ru will be converted into FCC crystalline structure with (111) orientation normal to film surface and upper portion of the stack (16-21) above Cr into a BCC (100) crystalline structure to achieve a large PMA while having a high tunnel magnetoresistive (TMR) value. For comparison, FIG. 6 shows actual two VSM test results obtained by growing two pSTT-MRAM both having an exactly same film stack of seed layer/[Co(0.5 nm)/Pt(0.25 nm)]3/Ru(0.4 nm)/W(0.25 nm)/CoFeB(1.1 nm)/MgO(1 nm)/CoFeB(1.3 nm)/W(0.25 nm)/CoFeB(0.6 nm)/MgO(1.0 nm)/W(2 nm)/Ru(14 nm) except sample-1 using a conventional seed layer and sample-2 using a tri-layer LmSL (curve-2) of CuN(10 nm)/Ta(1 nm)/Pt(2 nm) as a seed layer. While curve-1 exhibits a concurrent tSAF rotation under an external magnetic field during VSM measurement while curve-2 not only showing a larger RKKY coupling field but also exhibiting no concurrent rotation throughout the entire measurement range.

Third Embodiment

FIG. 7 is a top-pinned pSTT-MRAM film stack (500) with a thick pASF. Instead of using LmSL as seed layer, a material with BCC structure such as W or Ta is used as seed layer and LmSL is used as a top capping layer to promote formation of FCC crystalline structure for the reversed pMPL. The full film stack is in a reverse order of the above bottom-pinned pSTT-MRAM: i.e., starting a seed layer(30) such as (W or Ta) with a thickness between 2-10 nm, and MgO (1-1.5 nm)/tri-layer memory layer of first CoFeB(31) thickness between 0.5-0.8 nm/B absorption layer (Ta, W, or Mo)(32) thickness between 0.1-0.5 nm/second CoFeB(33) thickness between 0.9-1.5 nm/MgO tunnel barrier(34) thickness between 1 nm-1.5 nm/CoFeB reference layer(35) thickness between 0.9-1.3 nm/(Ta, W, Mo) crystalline structure transition layer (36) thickness between 0.1-0.5 nm/and a thick pSAF stack of [Co/Pt or Pd]n/Co(37)/(Ru or Ir)(38)/

Co/[Pt/Co]m(39)/capped with Pt/LmSL(40)/cap(41). The annealing temperature of above film stack is between 350 C-450 C for 30 min to 150 min. With the help of crystalline FCC structure of LmSL, the multilayer [Pt/Co]m (39) will start to crystalline from the surface in contact with said LmSL (40) and convert the entire pSAF [Co/Pt or Pd]n/Co (37)/(Ru or Ir)(38)/Co/[Pt/Co]m stack(37-41) into a FCC crystalline structure with (111) orientation normal to the film surface and the lower portion of the stack (30-35) into a BCC (100) crystalline structure obtaining a large PMA while maintaining high tunnel magnetoresistive (TMR) value. During annealing the layer (36) of Ta, W, or Mo helped the crystalline transition between top FCC to bottom BCC structure. Such a top-pinned pSTT-MRAM film stack will have strong magnetic pinning with high TMR value, which is good for spin-orbit torque (SOT) type MRAM device application.

Forth Embodiment

FIG. 8 is a top-pinned pSTT-MRAM film stack (600) with a thin eSAF coupling with a reversed layer structure (except the seed and capping layers) as compared with the above bottom-pinned pST-MRAM shown in FIG. 5 of stack 400, seed layer(50)/memory tri-layer(51,52,53)/MgO(54)/CoFeB (55)/Fe/Cr/(Ru,Rh, or Ir)(56)/Co/[Co/X]$_m$(57)/LmSL(58)/ cap layer(59). A seed layer (50) with BCC structure selected among (W, Ta or Pt)/MgO or BiSB/MgO was first grown on a substrate, followed a tri-layer memory layer (ML) stack (51,52,53) similar to the memory layers (31,32, 33) shown in FIG. 7, a tunnel barrier MgO(54), and a thin stack of CoFeB/Fe/Cr/(Ru, Rh, or Ir)/Co with a thickness of Ru, Rh, or Ir is between 0.3 to 0.7 nm and Cr thickness between 0.1 to 0.5 nm, in contact with a magnetic superlattice pinning layer (PL) of [Co/Pt, Pd, or Ni]$_m$/Co (12) (m is an integer between 2-6), which is immediately covered a said LmSL and a final cap of ((W/Ru/Ta). The annealing temperature of above film stack is between 350 C-450 C for 30 min to 150 min which will convert the lower portion of the stack below Cr into BCC crystalline structure under influence of the bottom BCC seed layer (50) of W or T while changing the upper portion of the pMPL stack into an FCC crystalline structure under influence of said LmSL crystalline FCC capping structure. Such a top-pinned pSTT-MRAM film stack will have strong magnetic pinning with sharp layer interfaces and higher and stable TMR characteristics, which is good for spin-orbit torque (SOT) type MRAM device application.

Fifth Embodiment

Figure 9:
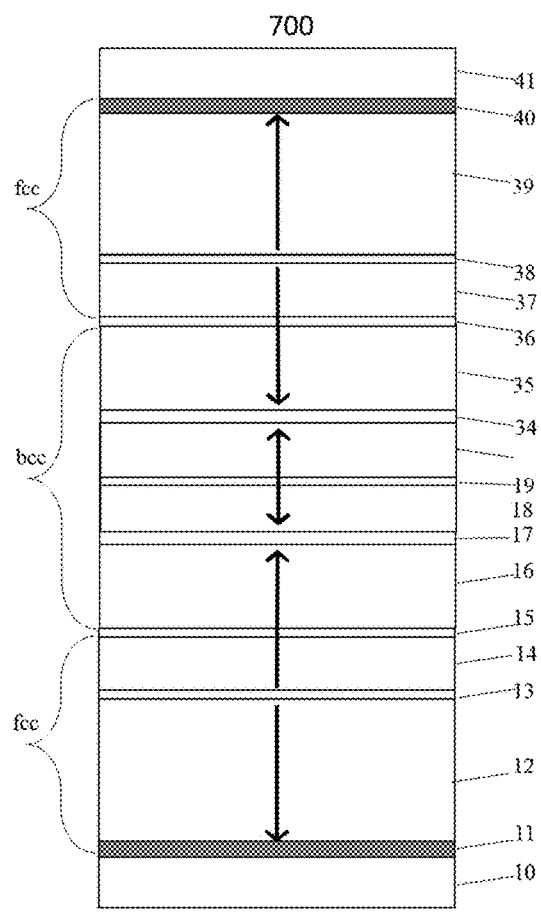
FIG. 9 A dual-pinned pSTT-MRAM containing two thick pSAF film stacks.
Figure 10:
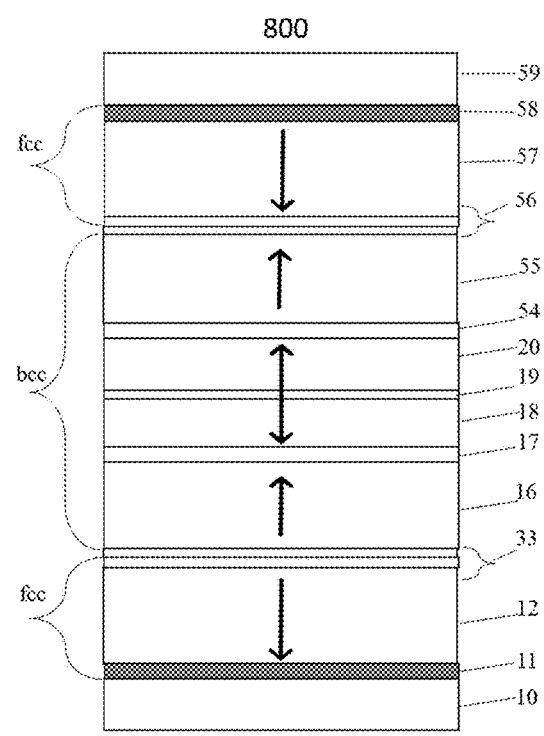
FIG. 10 A dual-pinned pSTT-MRAM containing two thick tSAF film stacks.

FIG. 9 is a dual-pinned pSTT-MRAM (700) with two thick pSAF and two LmSL stacks at bottom and top respectively, and FIG. 10 is a dual-pinned pSTT-MRAM (800) with two thin eSAF and two LmSL stacks at bottom and top respectively. A typical structure of stack of 700 including substrate (10)/LmSL(11)//[Co/(Pt or Pd)]$_m$/Co(12)/(Ru or Ir)(13)/Co/[(Pt or Pd)/Co]n(14)/(W, Mo or Ta)(15)/CoFeB (16)/MgO(17)/CoFeB(18)/(W or Mo)(19)/CoFeB(20)/MgO (34)/CoFeB(35)/(W,Mo or Ta)(36)/Co/[Co/Pt or Pd]n(37)/ Co/(Ru or Ir)(38)/Co/[(Pt or Pd)/Co]m(39)/LmSL(40)/cap (41), and a typical structure of stack 800 including substrate (10)LmSL(11)//[Co/(Pt or Pd)]$_m$/Co(12)/Ru/Cr/Fe/CoFeB (16)/MgO(17)/CoFeB(18)/(W or Mo)(19)/CoFeB(20)/MgO (54)/CoFeB/(55)/Fe/Cr/(Ru(56)/Co/[(Pt or Pd)/Co]m(57)/ LmSL(58)/cap(59). In these dual pSTT-MRAM structures, the two LmSL sandwich the two SAF pinning stacks. During high temperature annealing, said LmSL will force the two multilayers Co/(Pt or Pd)]$_m$ in contact with from the bottom (layers 11,12,13, 14 in sack 700 and layers 11,12,33 in stack 800) and top (layers 37, 38,39, 40 in stack 700 and layers 56,57,58 in stack 800) to transform into FCC crystalline structure with (111) orientation aligned normal to the film surface and all the middle layers (16,17,18,19,20,34,35 in stack 700 and layers 16,17,18,19,20,54,55 in stack 800 will transform into BCC crystalline structure with (100) orientation, which not only allows to further increase the perpendicular anisotropy (PMA) to the middle composite storage layer (CSL) and thus increase the thermal stability and prolong the retention time of MRAM device but also allows to increase the thickness of the CSL (from 1.8 nm to 4 nm) which further increases TMR value.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

TABLE 1

| Atomic No | Element | X-Structure | Lattice const [A] |
| --- | --- | --- | --- |
| 13 | Al | FCC | 4.05 |
| 28 | Ni | FCC | 3.52 |
| 29 | Cu | FCC | 3.61 |
| 45 | Rh | FCC | 3.8 |
| 46 | Pd | FCC | 3.89 |
| 47 | Ag | FCC | 4.09 |
| 77 | Ir | FCC | 3.84 |
| 78 | Pt | FCC | 3.92 |
| 79 | Au | FCC | 4.08 |
| 26 | Fe | BCC | 2.87 |
| 42 | Mo | BCC | 3.15 |
| 73 | Ta | BCC | 3.31 |
| 74 | W | BCC | 3.16 |
| 22 | Ti | HCP | 2.95/4.68 |
| 27 | Co | HCP | 2.51/4.07 |
| 44 | Ru | HCP | 2.70/4.28 |

The invention claimed is:

1. A perpendicular magnetic pinning element (pMPE) comprising
a lattice-matched seed layer (LmSL) having a face-center-cubic (FCC) crystalline structure;
a perpendicular magnetic pinning layer (pMPL) provided on the top surface of the LmSL and having a face-center-cubic (FCC) crystalline structure and having an invariable magnetization direction, and said LMSL/ pMPL forming a strong perpendicular magnetic anisotropy (PMA);
an antiferromagnetic coupling spacer (AFCs) provided on the top surface of the pMPL and having a single layer structure of (Ru, Rh or Ir), bi-layer structure of (Ru, Rh or Ir)/Cr or tri-layer structure of (Ru, Rh, or Ir)/(W, Mo, or V)/Cr;
a perpendicular magnetic reference layer (pMRL) provided on the top surface of the AFCs and having a body-center-cubic (BCC) crystalline structure and having an invariable magnetization direction;
said pMPE forming a strong antiferromagnetic coupling (AFC).

2. The element of claim 1, wherein said pMPL is a multilayer stack containing [Co/(Pt, Pd or Ni)]n/Co wherein n is an integer between 2 and 6, and thickness of each said Co and (Pt, Pd, or Ni) is between 0.25 nm-0.7 nm and 0.2 nm-0.8 nm, respectively.

3. The element of claim 1, wherein said LmSL is a bi-layer stack containing (Rh, Cu, Al, Ag, or Au)/((Pt, Pd, or Ir) or alloy of (Pt, Pd, or Ir)) or (alloy of Rh, Cu, Al, Ag, or Au)/((Pt, Pd, or Ir) or alloy of (Pt, Pd, or Ir)) having a FCC crystalline structure with its lattice constant matched with said pMPL and having a thickness between 0.5 nm-10 nm.

4. The element of claim 1, wherein said LmSL is a bi-layer stack containing (RhN, CuN, AlN, or AgN)/((Pt, Pd, or Ir) or alloy of (Pt, Pd, or Ir)) or (alloy of RhN, CuN, AlN, or AgN)/((Pt, Pd, or Ir) or alloy of (Pt, Pd, or Ir)) with nitrogen (N) content tuned so that said RhN, CuN, AN, AgN having its lattice constant matched with Pt, Pd, or Ir and having a thickness between 0.5 nm-10 nm.

5. The element of claim 1, wherein said LmSL is a multi-layer stack containing (RhN, CuN, AlN, or AgN)/X/((Pt, Pd, or Ir) or alloy of (Pt, Pd, or Ir)) or (alloy of RhN, CuN, AlN, or AgN)/X/((Pt, Pd, or Ir) or alloy of (Pt, Pd, or Ir)) with nitrogen (N) content tuned so that said RhN, CuN, AN, AgN having its lattice constant matched with Pt, Pd, or Ir and having a thickness between 0.5 nm-10 nm, whereas X is a thin layer consisting of one or more transition metal elements selected from the group of Ta, Mo, Hf, W, Nb, Zr, Ru and having a thickness no more than 2 nm.

6. The element of claim 1, wherein said LmSL is a multi-layer stack containing (RhN, CuN, AlN, or AgN)/X/((Pt, Pd, or Ir) or alloy of (Pt, Pd, or Ir)) or (alloy of RhN, CuN, AlN, or AgN)/X/((Pt, Pd, or Ir) or alloy of (Pt, Pd, or Ir)) with nitrogen (N) content tuned so that said RhN, CuN, AlN, AgN having its lattice constant matched with Pt, Pd, or Ir and having a thickness between 0.5 nm-10 nm, whereas X is a thin layer consisting of one or more transition metal elements selected from the group of Ta, Mo, Hf, W, Nb, Zr, Ru and having a thickness between 0.3 nm-1.0 nm.

7. The element of claim 1, wherein said LmSL and said pMPL both having their closed-packed FCC (111) crystalline orientation normal to the film surface.

8. The element of claim 1, wherein said pMRL containing a bi-layer stack of Fe/CoFeB, Fe/FeB, FeB/CoFeB, or Fe/CoFe and said Fe having a thickness between 0.1-0.5 nm, said CoFeB, FeB and CoFe having a thickness between 0.7 nm 1.3 nm.

9. The element of claim 1, wherein said pMRL containing a multilayer stack of Fe/[Co/(Pt, Pd or Ni)]m/(W or Mo)/CoFeB, with m an integer between 2 and 4; and the thickness of said Co and (Pt, Pd, or Ni) is between 0.25 nm-0.7 nm and 0.2 nm-0.8 nm, respectively, said CoFeB having a thickness between 0.7 nm-1.3 nm., said W, Mo having a thickness between 0.1 nm to 0.5 nm.

10. The element of claim 1, wherein said strong AFC between said pMPL and said pMRL is achieved through interfacial RKKY coupling having a film stack configuration of Co/AFCs/Fe or Co/AFCs/FeB, FeCo(>50%)/AFCs/Fe (>50%)Co, or Co/AFCs/Fe(>40%)CoB; wherein said Co or FeCo(>50%) layer is an interfacial portion of pMPL contacting with the (Ru, Rh, or Ir) of said AFCs and said Fe, FeB, Fe(>50%)Co or Fe(>40%)CoB layer is an interfacial portion of pMRL contacting with the Cr of said AFCs.

11. The element of claim 1, wherein said (Ru, Rh or Ir) in single layer structure of AFCs has a thickness between 0.4 nm to 0.85 nm, wherein said (Ru, Rh or Ir) in bi-layer or tri-layer structure has a thickness between 0.3 nm to 0.7 nm and said Cr or (W, Mo, or V)/Cr in said AFCs has a thickness between 0.1 nm to 0.5 nm so that the total thickness combination of Ru/Cr or (W, Mo, or V)/Cr is at the (effective) first peak or $2^{nd}$ peak of RKKY coupling with their interfacial magnetic layers of Co and Fe.

12. The element of claim 1, wherein said pMPE has its magnetization direction perpendicular to the surface of said film stack, and said pMPE further forms a perpendicular magnetic tunnel junction (pMTJ) together with a tunnel barrier (TB) and a storage layer (SL), whereas said TB is sandwiched between said SL and said pMPL.

13. The element of claim 12, wherein said TB is an MgO layer having a thickness between 0.8 nm to 1.5 nm, and said SL is a single layer CoFeB or tri-layer CoFeB/(W or Mo)/CoFeB having a total CoFeB thickness between 1 nm-2.0 nm, wherein said W or Mo has a thickness between 0.1 nm-0.5 nm.

14. The element of claim 12, wherein said pMTJ comprises a film stack of LmSL/pMPL/AFCs/pMRL/TB/SL/capping layer counting from bottom to top, forming a bottom-pinned pSTT-MRAM film element.

15. The element of claim 12, wherein said pMTJ comprises a film stack of BCC seed layer/SL/TB/pMRL/AFCs/pMPL/LmSL cap layer counting from bottom to top, forming a top-pinned pSTT-MRAM film element.

16. The element of claim 12, wherein said pMTJ comprises a film stack of LmSL/pMPL1/AFCs/pMRL/TB1/SL/TB2/pMRL2/AFCs2/pMPL2/LmSL cap layer, forming a dual-pinned pSTT-MRAM film element.

17. The element of claim 14, wherein said bottom-pinned pSTT-MRAM film element comprises a film stack of substrate/LmSL[Co/Pt]n/Co/(Ru, Rh, or Ir)/[Co/Pt]m/Co/(Ta, W or Mo)/CoFeB/MgO/CoFeB/(W or Mo)/CoFeB/MgO/W/Ru/Ta, with said superlattice repeating numbers n and m ranging from 2 to 6 and 1 to 4 respectively.

18. The element of claim 14, wherein said bottom-pinned pSTT-MRAM film element comprises a film stack of substrate/LmSL[Co/Pt]n/Co/(Ru, Rh, or Ir)/Cr/Fe/CoFeB/MgO/CoFeB/W or Mo/CoFeB/MgO/W/Ru/Ta or substrate/Pt/[Co/Pt]n/Co/(Ru, Rh, or Ir)/(W, Mo, or V)/Cr/Fe/CoFeB/MgO/CoFeB/W, Mo/CoFeB/MgO/W/Ru/Ta.

19. The element of claim 16, wherein said dual-pinned pSTT-MRAM film element comprises a film stack of substrate/LmSL[Co/Pt]n/Co/(Ru, Rh or Ir)/Cr/Fe/CoFeB/MgO/CoFeB/W or Mo/CoFeB/MgO/CoFeB/Fe/Cr/(Ru, Rh or Ir)/Co/[Pt/Co]n/LmSL/W/Ru or substrate/LmSL[Co/Pt]n/Co/(Ru, Rh, or Ir)/(W,Mo, or V)/Cr/Fe/CoFeB/MgO/CoFeB/W or Mo/CoFeB/MgO/CoFeB/Fe/Cr/(W, Mo, or V)(Ru, Rh or Ir)/Co/[Pt/Co]n/LmSL/W/Ru.

20. The element of claim 16, wherein said dual-pinned pSTT-MRAM film element comprises a film stack of substrate/or substrate/LmSL//[Co/(Pt or Pd)]$_m$/Co/(Ru or Ir)/Co/[(Pt or Pd)/Co]n/(W, Mo or Ta)/CoFeB/MgO/CoFeB/(W or Mo)/CoFeB/MgO/CoFeB/(W, Mo or Ta)/Co/[Co/Pt or Pd]n/Co/(Ru or Ir)/Co/[(Pt or Pd)/Co]m/LmSL/cap.

* * * * *